(12) United States Patent
Watanabe et al.

(10) Patent No.: US 12,082,339 B2
(45) Date of Patent: Sep. 3, 2024

(54) IMAGE PICKUP APPARATUS

(71) Applicant: CANON KABUSHIKI KAISHA, Tokyo (JP)

(72) Inventors: Kentaro Watanabe, Tokyo (JP); Kenji Ishii, Kanagawa (JP); Takashi Yoshida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 131 days.

(21) Appl. No.: 18/048,622

(22) Filed: Oct. 21, 2022

(65) Prior Publication Data

US 2023/0164918 A1 May 25, 2023

(30) Foreign Application Priority Data

Nov. 25, 2021 (JP) .................................. 2021-191536

(51) Int. Cl.
*H04N 23/52* (2023.01)
*H04N 23/54* (2023.01)
*H04N 23/68* (2023.01)
*H05K 1/02* (2006.01)
*H05K 1/14* (2006.01)
*H05K 7/20* (2006.01)

(52) U.S. Cl.
CPC ............. *H05K 1/147* (2013.01); *H04N 23/52* (2023.01); *H04N 23/54* (2023.01); *H05K 1/0203* (2013.01); *H05K 7/20136* (2013.01); *H04N 23/687* (2023.01); *H05K 2201/10151* (2013.01)

(58) Field of Classification Search
CPC ........ H04N 23/50; H04N 23/51; H04N 23/52; H04N 23/54; H04N 23/687; H05K 1/147; H05K 1/0203; H05K 7/20103; H05K 2201/10151
See application file for complete search history.

(56) References Cited

U.S. PATENT DOCUMENTS

| | | | | |
|---|---|---|---|---|
| 2016/0301819 A1* | 10/2016 | Petty | ...................... | G03B 17/55 |
| 2019/0385927 A1* | 12/2019 | Shibata | .................. | H04N 23/52 |
| 2021/0306531 A1* | 9/2021 | Toda | .................... | H04N 23/687 |
| 2021/0373417 A1* | 12/2021 | Iritani | ................. | G03B 17/563 |
| 2023/0164918 A1* | 5/2023 | Watanabe | .............. | H04N 23/52 |
| | | | | 348/208.7 |
| 2023/0164945 A1* | 5/2023 | Watanabe | .......... | H05K 7/20145 |
| | | | | 361/695 |

FOREIGN PATENT DOCUMENTS

JP 2020030393 A 2/2020

* cited by examiner

*Primary Examiner* — Daniel M Pasiewicz
(74) *Attorney, Agent, or Firm* — Canon U.S.A., Inc. IP Division

(57) ABSTRACT

An image pickup apparatus includes an image sensor, a first circuit board on which the image sensor is mounted, a second circuit board facing the first circuit board, a flexible board that electrically connects the first circuit board and the second circuit board, and a fan. The image sensor moves within a movable range of the image sensor in a direction different from an optical axis direction. The flexible board includes a bent portion that is located closest to a side of the flexible board connected to the first circuit board. The flexible board is bent in an area overlapping the movable range of the image sensor in the optical axis direction. As viewed from the optical axis direction, an inner surface of the bent portion is disposed to be outside a range of a blowing direction of an airflow discharged from a vent of the fan.

8 Claims, 11 Drawing Sheets

A-A SECTION VIEW

B-B SECTION VIEW

C-C SECTION VIEW

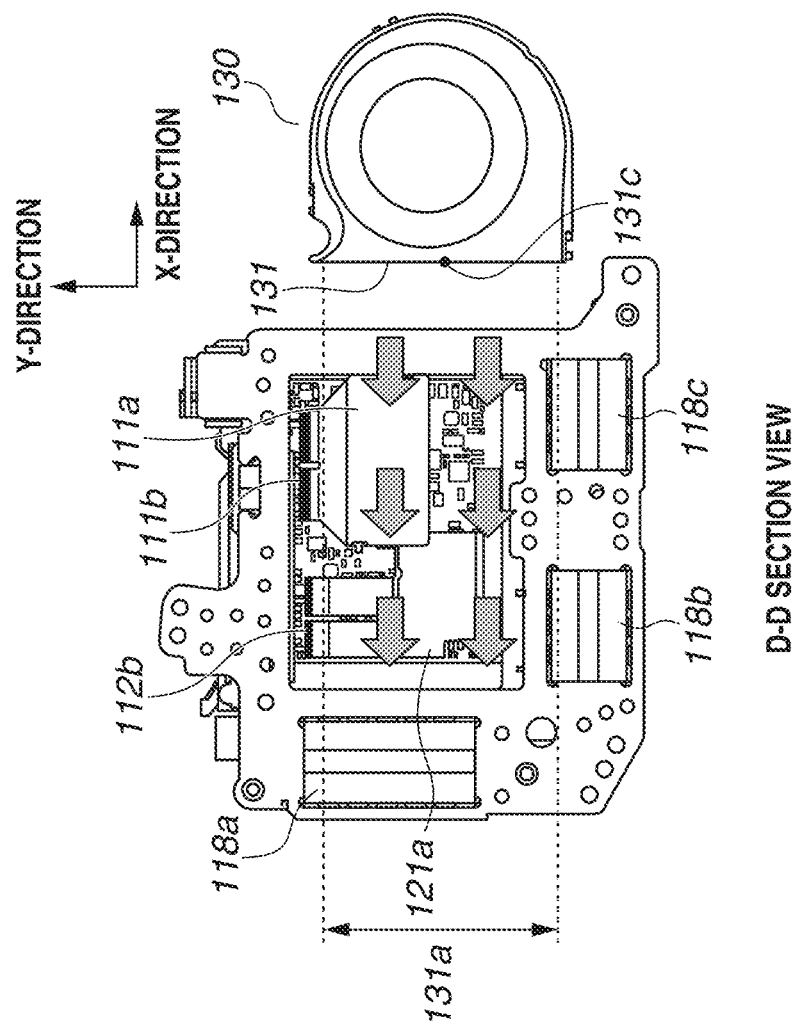
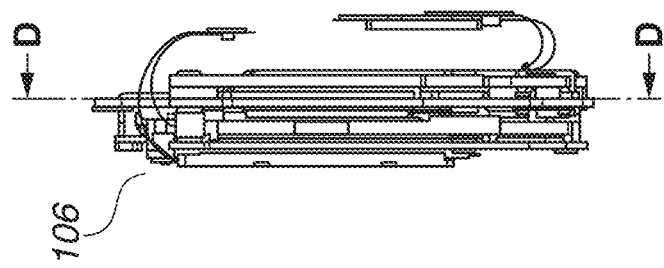

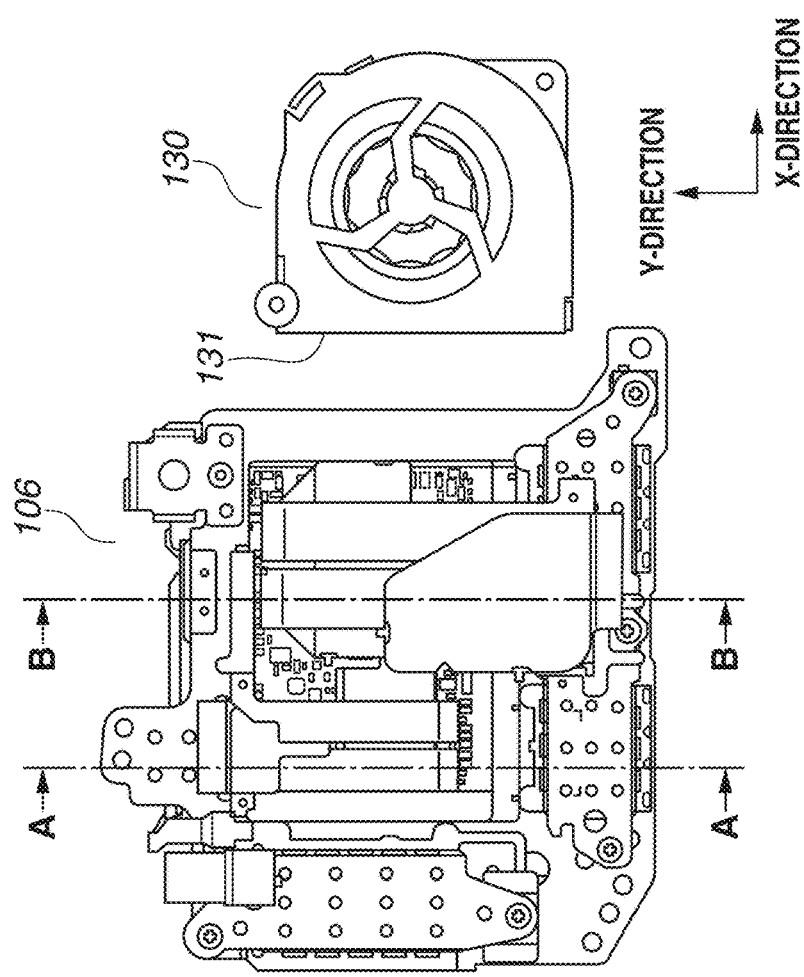

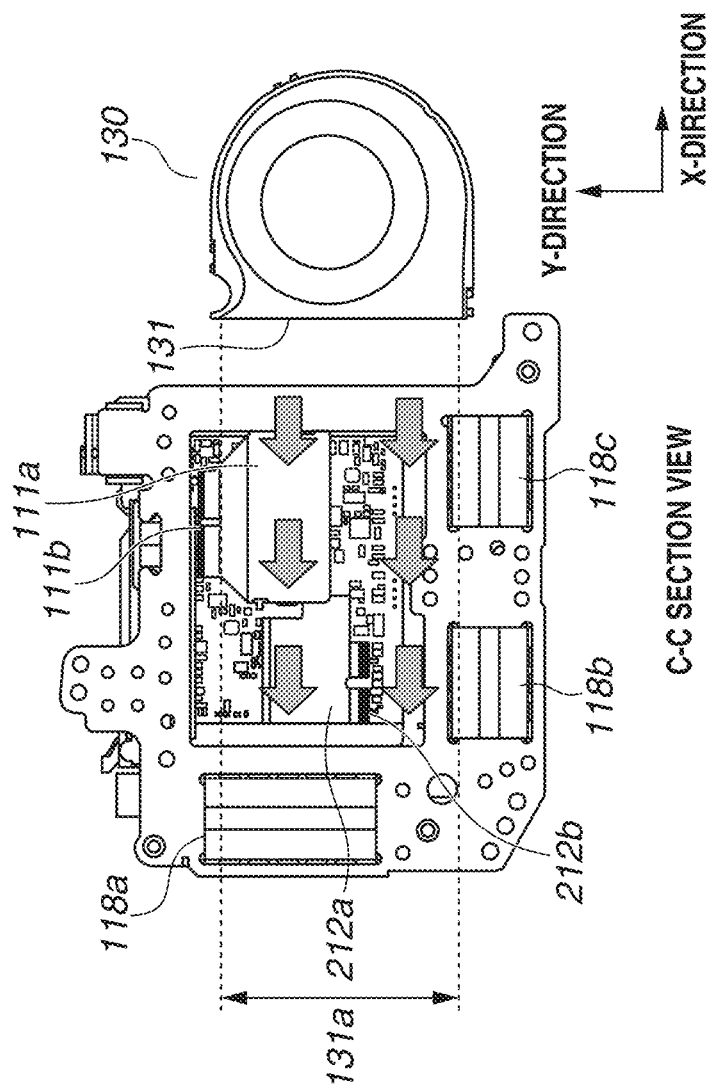

A-A SECTION VIEW

B-B SECTION VIEW

C-C SECTION VIEW

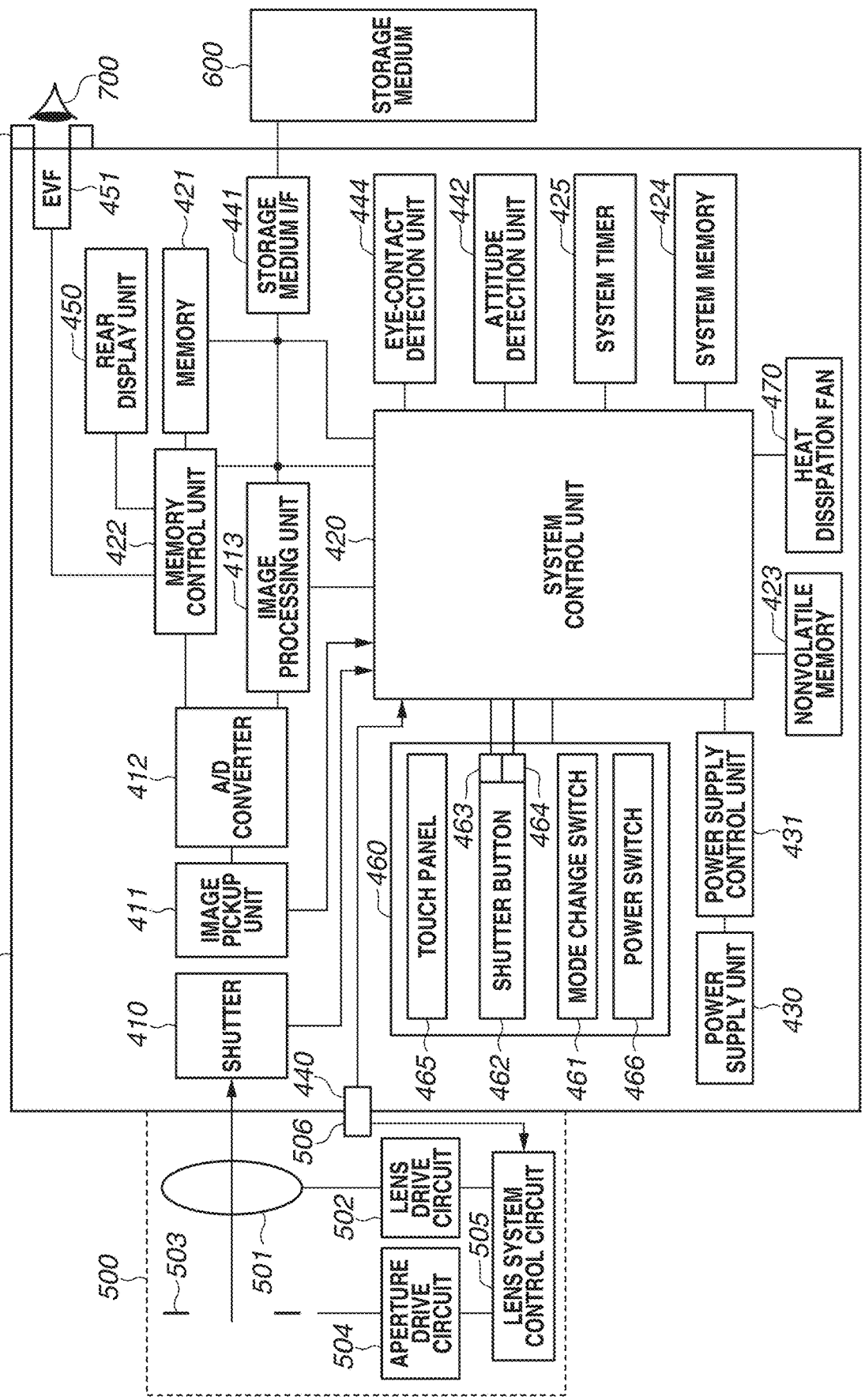

IMAGE PICKUP APPARATUS

BACKGROUND

Field

The present disclosure relates to an image pickup apparatus having a structure for dissipating heat generated from a heat source.

Description of the Related Art

With a recent demand for downsizing of electronic apparatuses, mounted components in the apparatuses have been remarkably downsized and densified.

Meanwhile, a demand for higher functionality of an image pickup apparatus, in particular, higher performance of a moving image function has been increasing, and the amount of heat generation of the apparatus has been on the rise.

At the time of capturing a moving image in a high-temperature environment, a temperature rise in the image pickup apparatus is likely to cause a malfunction or performance degradation of a mounted component, and eventually cause a breakdown of the image pickup apparatus.

To address this, a heat dissipation structure using forced air cooling with a fan or a heat conduction member is used in a case where the amount of heat dissipation using natural heat dissipation is not sufficient with respect to the amount of heat generation of the image pickup apparatus.

Japanese Patent Application Laid-Open No. 2020-030393 discusses an apparatus in which a heat conduction member is connected to a movable image sensor to cool the image sensor.

In recent years, an image pickup apparatus that performs shake correction by moving an image sensor in a direction orthogonal to an optical axis direction has been widespread in order to improve image quality.

Such an image pickup apparatus that performs shake correction is also desirable to provide sufficient heat dissipation because heat generated in the image sensor affects image quality at the time of driving a shake correction mechanism, continuously capturing images, or capturing a moving image.

In the apparatus discussed in Japanese Patent Application Laid-Open No. 2020-030393, however, the heat conduction member is physically connected to the movable image sensor, and thus there is an issue where the operation of the image sensor is obstructed.

SUMMARY

The present disclosure is directed to an image pickup apparatus that achieves satisfactory heat dissipation performance without obstructing the operation of a movable image sensor.

According to an aspect of the present disclosure, an image pickup apparatus includes an image sensor configured to move within a movable range of the image sensor in a direction different from an optical axis direction, a first circuit board on which the image sensor is mounted, a second circuit board facing the first circuit board, a first flexible board configured to electrically connect the first circuit board and the second circuit board, and a fan, wherein the first flexible board includes a bent portion that is located closest to a side of the first flexible board connected to the first circuit board, wherein the first flexible board is bent in an area overlapping the movable range of the image sensor in the optical axis direction, and wherein, as viewed from the optical axis direction, an inner surface of the bent portion of the first flexible board is disposed to be outside a range of a blowing direction of an airflow discharged from a vent of the fan.

Further features of the present disclosure will become apparent from the following description of exemplary embodiments with reference to the attached drawings.

BRIEF DESCRIPTION OF THE DRAWINGS

FIG. 6A is a side view of the image sensor unit according to the first exemplary embodiment, and FIG. 6B is a D-D section view of the image sensor unit and the heat dissipation fan according to the first exemplary embodiment.

FIGS. 7A and 7B are an A-A section view and a B-B section view, respectively, of an image sensor unit according to a second exemplary embodiment of the present disclosure, and FIG. 7C is a rear view of the image sensor unit and a heat dissipation fan according to the second exemplary embodiment.

FIG. 8A is a side view of the image sensor unit according to the second exemplary embodiment, and FIG. 8B is a C-C section view of the image sensor unit and the heat dissipation fan according to the second exemplary embodiment.

FIG. 11 is a block diagram according to an exemplary embodiment of the present disclosure.

DESCRIPTION OF THE EMBODIMENTS

Figure 1:
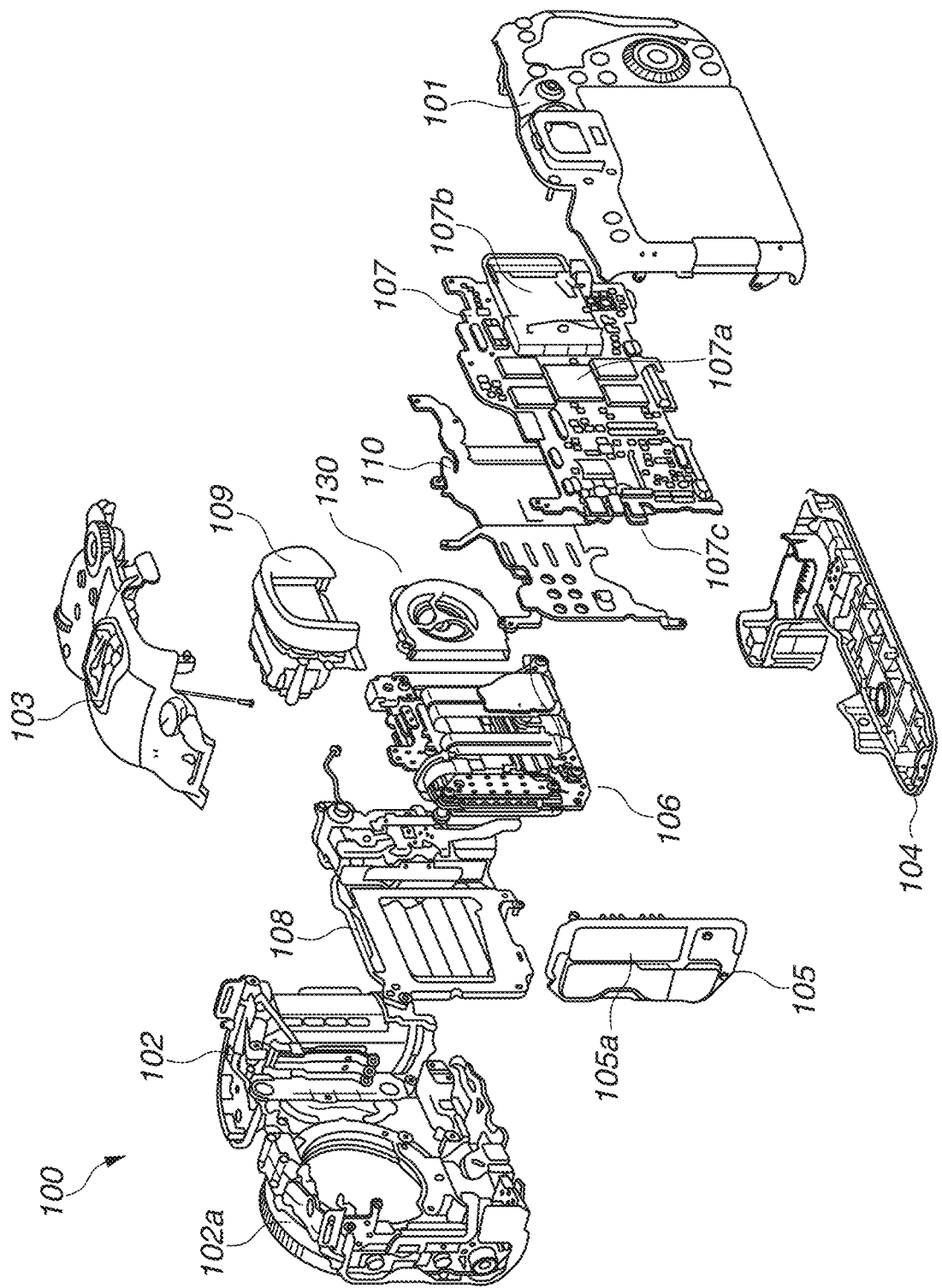
FIG. 1 is a rear exploded perspective view of a digital camera according to a first exemplary embodiment of the present disclosure.

Exemplary embodiments of the technique of the present disclosure will be described in detail below with reference to the drawings.

The dimensions, materials, and shapes of components to be described below and the relative arrangements and the like of the components may be modified as appropriate depending on the configuration of an apparatus to which an exemplary embodiment of the present disclosure is applied and various conditions.

Thus, the following description is not intended to limit the scope of the disclosure.

In particular, a well-known technique or a publicly known technique in the technical field concerned can be applied to a configuration or a process that is not illustrated in the drawings or not described in the specification. Besides, a repeated description can be omitted.

In the drawings, the same reference numerals are used to indicate the identical or functionally similar components.

<Rear Exploded Perspective View of Digital Camera>

FIG. 1 is a rear exploded perspective view of a digital camera 100 that is an image pickup apparatus according to a first exemplary embodiment of the present disclosure.

The digital camera 100 includes a mount unit 102a, a rear cover 101, a front base 102, a top cover 103, a bottom cover 104, and a side cover 105, as illustrated in FIG. 1.

An image sensor unit 106 having an image blur correction mechanism, a main board 107, a shutter 108, a viewfinder 109, and a chassis 110 are disposed inside the digital camera 100.

The image sensor unit 106 includes a movable unit 114 (see FIG. 2A) and a fixing unit, and is disposed perpendicularly to an optical axis. The movable unit 114 includes an image sensor 115 (see FIG. 2A).

The front base 102 is formed of, for example, a magnesium die cast or resin, and includes the mount unit 102a for mounting an interchangeable lens.

The main board 107 is formed of a multilayer board, and electronic components are mounted on both sides thereof. The main board 107 is fixed to the front base 102 and the chassis 110 made of metal by screws.

The main board 107 is mounted with a control integrated circuit (IC) 107a for controlling an image pickup signal and the like, a storage medium connector 107b for housing an external storage medium, and an external communication terminal 107c for connecting a connection cable to an external apparatus.

The external communication terminal 107c is covered by a terminal cover 105a.

Among the components of the digital camera 100, the image sensor unit 106, in particular, has high power consumption and also generates a large amount of heat, thereby causing a significant temperature rise.

The maximum duration that the digital camera 100 can perform imaging is limited by the operation guarantee temperature of each of the components.

To maintain the maximum imaging duration as long as possible, it is desirable to prevent the operation guarantee temperature from being exceeded, by releasing the heat of the image sensor unit 106 which is a heat source.

The image sensor unit 106 is fixed to the front base 102 by screws, so that the heat of the image sensor unit 106 is released to the front base 102.

A heat dissipation fan 130 is disposed near the image sensor unit 106 to have a blowing direction perpendicular to the optical axis, so that air passing behind the image sensor unit 106, which is a heat source, prevents the image sensor unit 106 from becoming locally hot (which will be described in detail below).

In the present exemplary embodiment, the heat dissipation fan 130 uses a centrifugal fan as an air blowing unit, but is not limited thereto, and may use, for example, an axial fan as long as the purpose can be achieved.

Further, in the present exemplary embodiment, the blowing direction of the heat dissipation fan 130 is perpendicular to the optical axis, but is not limited thereto. The blowing direction may not necessarily be perpendicular to the optical axis if an airflow from the heat dissipation fan 130 directly hits the image sensor unit 106.

The main board 107 is also a heat source, and thus the heat dissipation fan 130 is disposed so that a vent 131 thereof (see FIG. 3A) is directed to an area between the image sensor unit 106 and the main board 107 to blow air into the area.

This makes it possible to produce a heat dissipation effect for a plurality of heat sources.

However, the image sensor unit 106 including the movable unit 114 has fewer heat dissipation paths, and thus it is advantageous, in terms of heat dissipation, that the vent 131 of the heat dissipation fan 130 is located at a position closer to the image sensor unit 106 than to the main board 107.

<Image Sensor Unit>

Figure 2A:
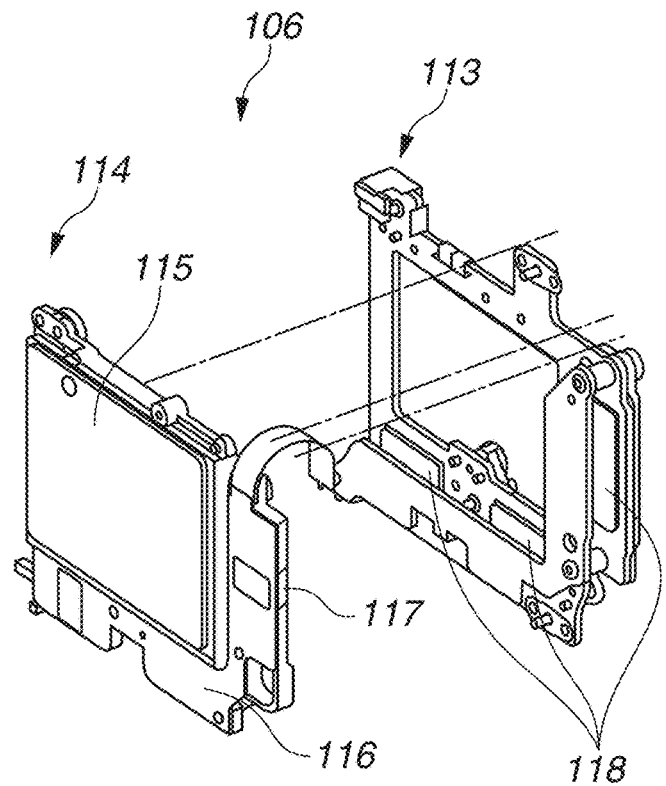
FIGS. 2A and 2B are a front exploded perspective view and a rear exploded perspective view, respectively, of an image sensor unit according to the first exemplary embodiment.
Figure 2B:
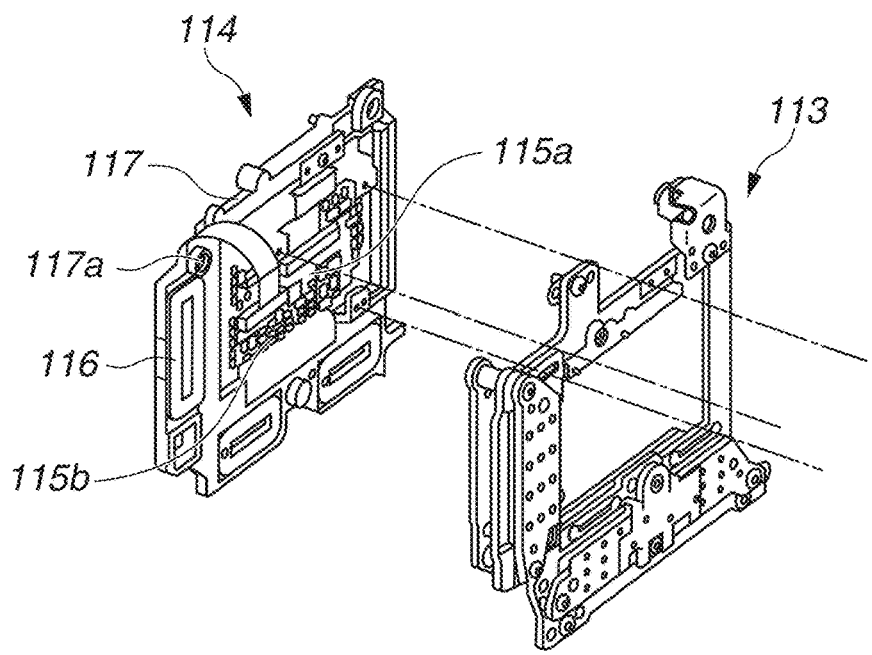

Details of the image sensor unit 106 will be described with reference to FIGS. 2A and 2B. FIGS. 2A and 2B are a front exploded perspective view and a rear exploded perspective view, respectively, of the image sensor unit 106.

The movable unit 114 includes a coil portion 116 in which a coil for moving the image sensor 115 and a Hall element are disposed and which is held by a sensor holder 117.

Three magnets 118 are held in a drive mechanism 113, and the movable unit 114 is attracted and held by the magnets 118.

A ball (not illustrated) is held in a ball holding portion 117a of the sensor holder 117 and located between the movable unit 114 and the drive mechanism 113.

The movable unit 114 can be moved by changing the amount of energization of the coil portion 116.

Shake correction can be performed by moving the movable unit 114 in a direction that cancels out the shake of the main body of the digital camera 100.

The image sensor 115 is mounted on an image pickup board 115a. More specifically, a sensor chip (not illustrated) is bonded to the image pickup board 115a on which an image pickup circuit is mounted, and is electrically connected onto the image pickup board 115a by wire bonding.

The image sensor 115 and the sensor holder 117 are fixed to each other by an adhesive.

Elements 115b such as a condenser, a resistor, and a regulator of the image pickup circuit are mounted on a back surface of the image pickup board 115a that is opposite to the surface of the image pickup board 115a to which the sensor chip is bonded.

The image sensor unit 106 and the main board 107 are electrically connected using a flexible wiring board.

On an image pickup signal flexible board 111 (see FIG. 4), wiring for an image pickup signal output from the image sensor 115 and a control signal for driving the image sensor 115 is formed, and the signals are transmitted to the control IC 107a on the main board 107.

An image pickup power flexible board 112 (see FIG. 4) supplies power for driving the image sensor 115. A board-to-board connector is used to connect the image pickup board 115a and each of the flexible boards 111 and 112.

<Rear View and Rear Schematic View of Heat Dissipation Fan and Image Sensor Unit>

Figure 3A:
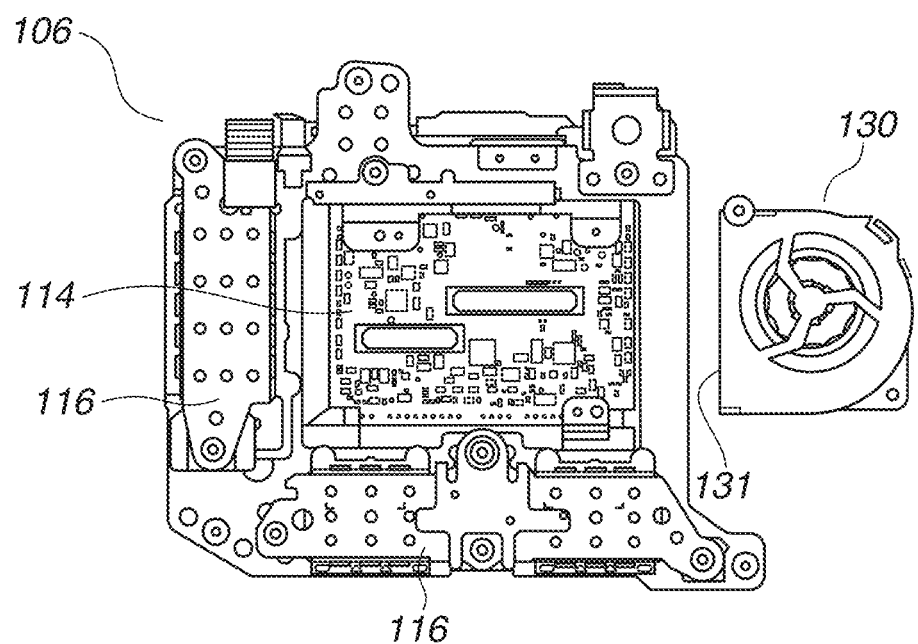
FIGS. 3A and 3B are a rear view and a rear schematic view, respectively, of the image sensor unit and a heat dissipation fan according to the first exemplary embodiment.
Figure 3B:
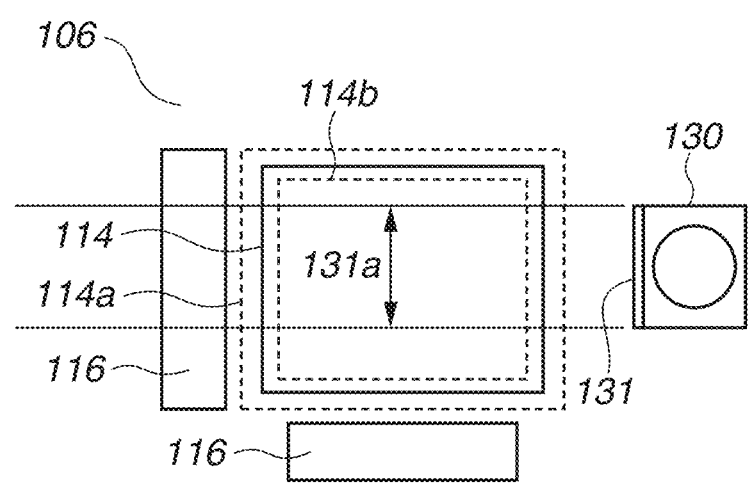

FIGS. 3A and 3B are a rear view and a rear schematic view of the heat dissipation fan 130 and the image sensor unit 106, respectively.

Referring to FIGS. 3A and 3B, the movement of the movable unit 114 of the image sensor unit 106 and the positional relationship between the movable unit 114 and the heat dissipation fan 130 will be described.

The movable unit 114 is movable perpendicularly to the optical axis within a movable range 114a. A range in which the movable unit 114 is always present even if moved is indicated by a range 114b.

This is the range in which the movable unit 114 is present whichever position the movable unit 114 is moved to within the movable range 114a.

Next, placement of the heat dissipation fan 130 will be described. The heat dissipation fan 130 blows air so that the air runs behind the image sensor unit 106 as described above.

More specifically, the vent 131 of the heat dissipation fan 130 is directed so that the air is blown to the range 114b where the movable unit 114 is always present even if moved.

In FIG. 3B, a blowing range 131a indicates a range of the blowing direction. Because the blowing range 131a is within the range 114b, a heat dissipation effect can be obtained whichever position the movable unit 114, which is a heat source of the image sensor unit 106, is moved to.

In addition, the heat dissipation fan 130 is not physically connected to the movable unit 114, and thus it is possible to produce the heat dissipation effect without hindering the shake correction function performed by moving the movable unit 114.

<Positional Relationship Among Image Pickup Signal Flexible Board, Image Pickup Power Flexible Board, and Heat Dissipation Fan>

Further, the positional relationship among the image pickup signal flexible board 111, the image pickup power flexible board 112, and the heat dissipation fan 130 will be described in detail with reference to FIG. 4 and FIGS. 5A to 5D.

Figure 4:
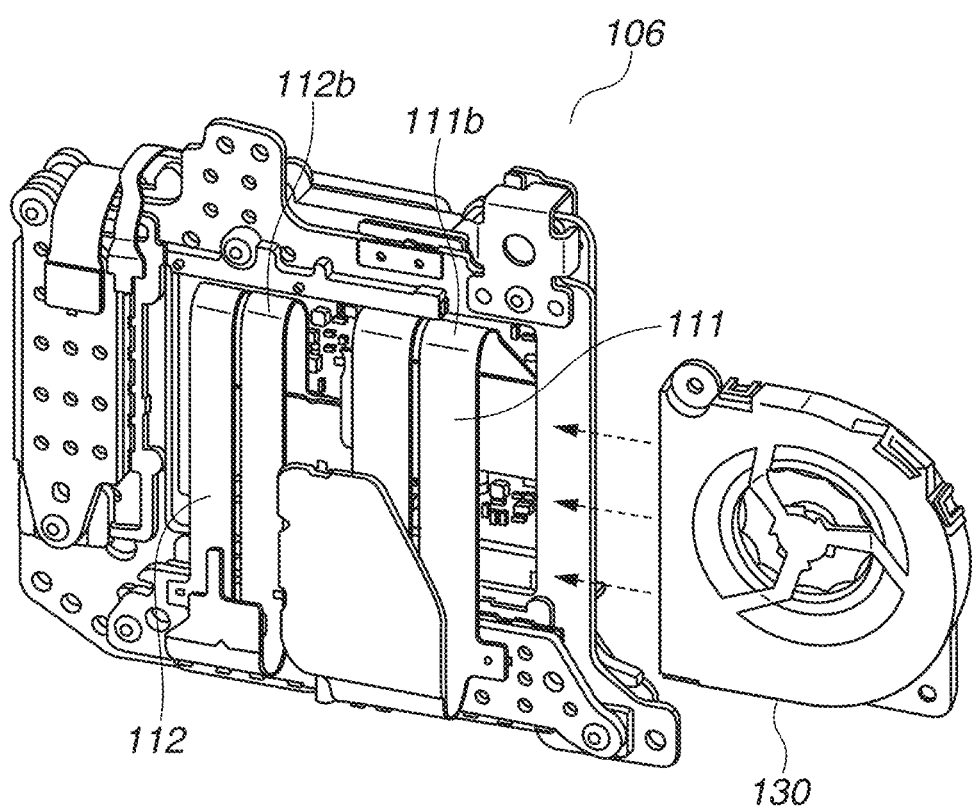
FIG. 4 is a rear perspective view of the image sensor unit and the heat dissipation fan according to the first exemplary embodiment.

FIG. 4 is a rear view of the image sensor unit 106 and the heat dissipation fan 130 when viewed obliquely from a rear of the digital camera 100.

As illustrated in FIG. 4, the image sensor unit 106 includes the image pickup power flexible board 112 and the image pickup signal flexible board 111 that are fixed to each of the movable unit 114 and the drive mechanism 113.

Figure 5A:
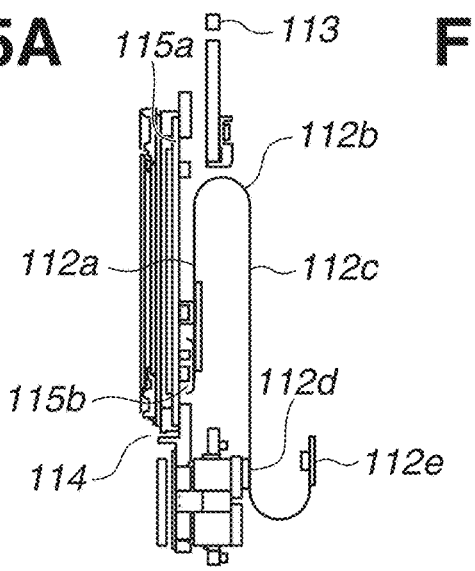
FIGS. 5A, 5B, 5C, and 5D are an A-A section view, a B-B section view, a C-C section view, and a rear view, respectively, of the image sensor unit and the heat dissipation fan according to the first exemplary embodiment.
Figure 5B:
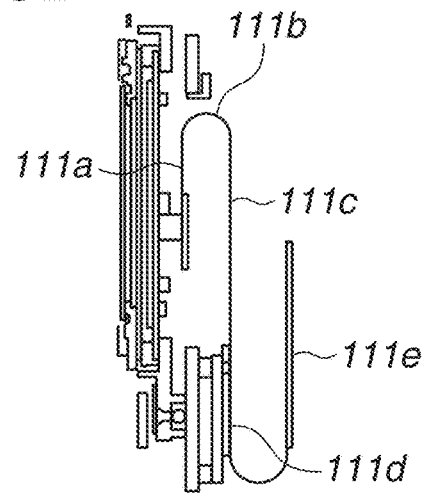
Figure 5C:
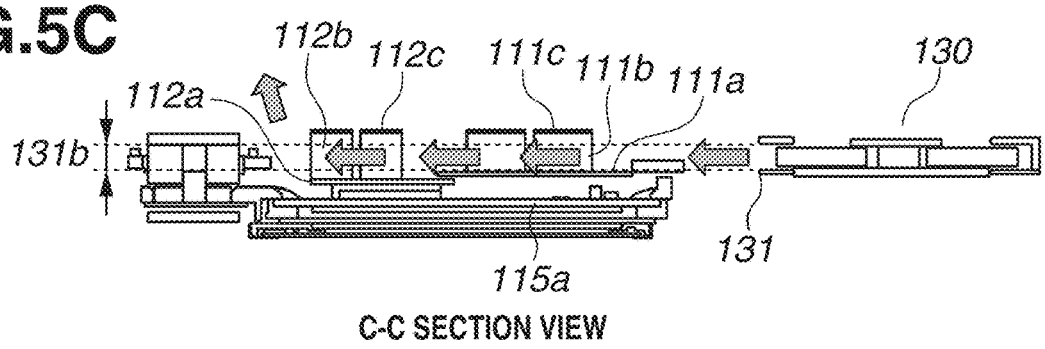
Figure 5D:
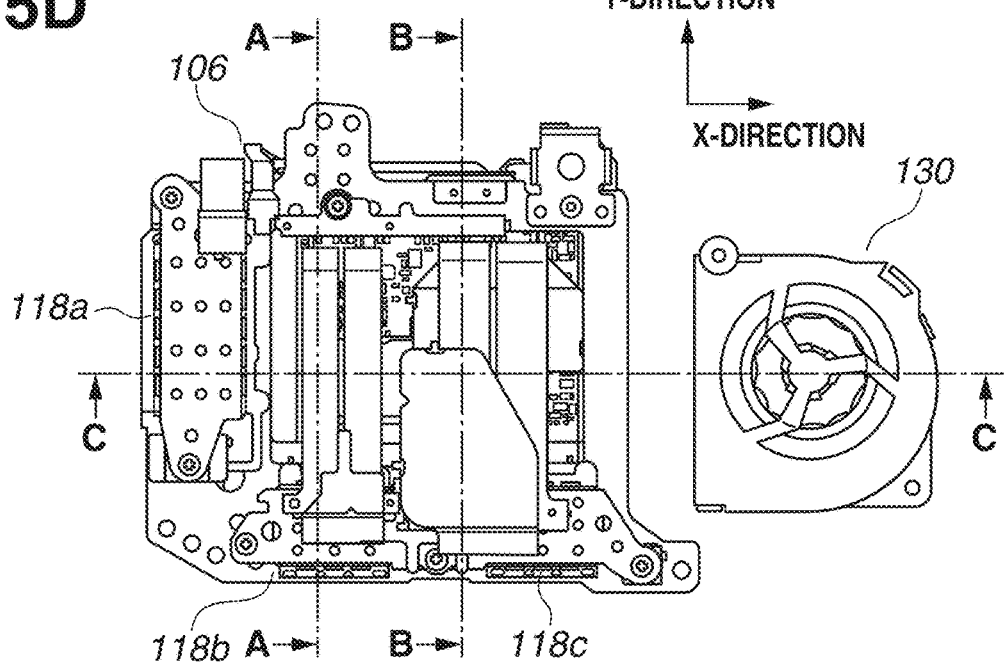

FIG. 5D is a rear view of the image sensor unit 106, and FIGS. 5A, 5B, and 5C illustrate an A-A section, a B-B section, and a C-C section in FIG. 5D, respectively.

As illustrated in FIG. 5A, the image pickup power flexible board 112 has a first end portion 112a that is connected to a connector mounted on the surface of the image pickup board 115a where the elements 115b are mounted. The first end portion 112a extends therefrom in a direction substantially parallel to the image pickup board 115a.

The image pickup power flexible board 112 further has a bent portion 112b extending from the first end portion 112a and bent 180 degrees with a predetermined bending radius, and a residual portion 112c forming a portion between the bent portion 112b and a fixing portion 112d for fixing the image pickup power flexible board 112 to the drive mechanism 113.

A second end portion 112e extending from the fixing portion 112d is connected to the main board 107.

The movable unit 114 of the image sensor unit 106 is thereby driven for shake correction.

The bent portion 112b and the residual portion 112c absorb deformation of the image pickup power flexible board 112, thereby reducing the influence of the tension of the image pickup power flexible board 112 on the control of the movable unit 114.

As illustrated in FIG. 5B, the image pickup signal flexible board 111 has a bending configuration similar to the configuration of the image pickup power flexible board 112 in order to keep the influence of the tension thereof on the control of the movable unit 114 to a minimum.

Further, as illustrated in FIG. 5D, when the lateral direction and the vertical direction viewed from the rear of the digital camera 100 are defined as an X-direction and a Y-direction, respectively, the three magnets 118 included in the drive mechanism 113 are divided into an X-direction magnet 118a and Y-direction magnets 118b and 118c in terms of driving force generation direction.

The Y-direction magnet 118b is disposed closer to the X-direction magnet 118a than the Y-direction magnet 118c.

A bent portion 111b of the image pickup signal flexible board 111 and the bent portion 112b of the image pickup power flexible board 112 are formed on a side away from the Y-direction magnets 118b and 118c across a connection portion with the image pickup board 115a.

Further, as illustrated in FIG. 5C, when the heat dissipation fan 130 is observed from a plane direction perpendicular to the optical axis, the range of the blowing direction is defined as a blowing range 131b.

In the blowing range 131b, the airflow from the heat dissipation fan 130 passes through at least a part of a space between a residual portion 111c of the image pickup signal flexible board 111 and the image pickup board 115a and between the residual portion 112c of the image pickup power flexible board 112 and the image pickup board 115a.

Further, the vent 131 of the heat dissipation fan 130 is disposed to face the image sensor unit 106.

Thus, as illustrated in FIG. 5C, the bent portion 111b connecting a first end portion 111a and the residual portion 111c of the image pickup signal flexible board 111 overlaps the blowing range 131b.

The bent portion 112b connecting the first end portion 112a and the residual portion 112c of the image pickup power flexible board 112 overlaps the blowing range 131b.

The movement of the airflow generated by the heat dissipation fan 130 will now be described with reference to FIGS. 5C, 6A, and 6B. FIG. 6A illustrates the image sensor unit 106 viewed from a side of the digital camera 100. FIG. 6B illustrates a D-D section in FIG. 6A.

As indicated by arrows in FIG. 5C, the airflow generated by the heat dissipation fan 130 is discharged from the vent 131 and subsequently passes through the space between the image pickup board 115a and each of the residual portion 111c of the image pickup signal flexible board 111 and the residual portion 112c of the image pickup power flexible board 112.

At this time, the air on the image pickup board 115a to which heat is transferred from the image pickup board 115a is moved along the arrows in FIG. 5C by the airflow from the heat dissipation fan 130, and diffused inside the digital camera 100.

When the image sensor unit 106 is observed from the rear of the digital camera 100 at this time, the air flows as indicated by arrows in FIG. 6B.

The bent portions 111b and 112b each overlap the blowing range 131b as described above, but the heat dissipation fan 130 is disposed so that the bent portions 111b and 112b are outside the blowing range 131a.

It is thus possible to implement the bending configuration without obstructing the airflow due to the bent portions 111b and 112b.

As a result, the airflow generated by the heat dissipation fan 130 can spread out over a wide area on the image pickup board 115a, so that a temperature rise of the image sensor 115 can be effectively suppressed.

In addition, the position of each of the bent portions 111b and 112b slightly changes in the Y-direction when the movable unit 114 is driven.

Thus, it is desirable to dispose the bent portions 111b and 112b at positions a certain distance from the Y-direction magnets 118b and 118c in the Y-direction in order to prevent the bent portions 111b and 112b from coming into contact with the Y-direction magnets 118b and 118c and affecting the attitude control of the movable unit 114.

In the present exemplary embodiment, the bent portions 111b and 112b are formed at positions facing the Y-direction magnets 118c and 118b, respectively, across the connection portion with the image pickup board 115a.

Further, as illustrated in FIG. 6B, a vent center 131c of the heat dissipation fan 130 is disposed between the bent portions 111b and 112b and the Y-direction magnets 118b and 118c.

Such a configuration makes it possible to include the distance for preventing the bent portions 111b and 112b from coming into contact with the Y-direction magnets 118b and 118c, in the blowing range 131a.

Therefore, even if the heat dissipation fan 130 is disposed so that the bent portions 111b and 112b are outside the blowing range 131a, a large area where the blowing range 131a and the image pickup board 115a overlap each other can be secured when viewed from the optical axis direction, and the heat dissipation efficiency is high.

Moreover, such a configuration prevents the bent portions 111b and 112b from receiving a force from the airflow generated by the heat dissipation fan 130, so that the influence on the controllability of the movable unit 114 can be reduced.

Features of the present exemplary embodiment are as follows.

One of the features is that the closest bent portion 112b (a bent portion closest to a side of the image pickup power flexible board 112 connected to the image pickup board 115a) is not within the range of the blowing direction.

An image pickup apparatus (the digital camera 100) according to the present exemplary embodiment includes an image sensor (the image sensor 115) configured to move within a movable range of the image sensor in a direction different from an optical axis direction, a first circuit board (the image pickup board 115a) on which the image sensor is mounted, and a second circuit board (the main board 107) facing the first circuit board.

The image pickup apparatus further includes a first flexible board (the image pickup power flexible board 112) configured to electrically connect the first circuit board and the second circuit board, and a fan (the heat dissipation fan 130).

The first flexible board is bent in an area overlapping the movable range of the image sensor in the optical axis direction.

As viewed from the optical axis direction, an inner circumferential surface (an inner surface) of a bent portion (the bent portion 112b) of the first flexible board, which is closest to a side of the first flexible board connected to the first circuit board, is disposed to be outside a range (the blowing range 131a) of a blowing direction of an airflow discharged from a vent of the fan.

Another feature of the present exemplary embodiment is that the closest bent portion 112b, the connection portion, and the y-direction magnet 118b are disposed in order from a top side of the image pickup apparatus.

The image pickup apparatus further includes a magnet (the magnets 118) configured to move the image sensor within the movable range.

The bent portion closest to the side connected to the first circuit board is disposed at a position facing the magnet across a connection portion connecting the first circuit board and the first flexible board.

Yet another feature of the present exemplary embodiment is a position of a center of the vent of the fan.

As viewed from the optical axis direction, a center of the vent of the fan is located between the bent portion closest to the side connected to the first circuit board and the magnet.

Yet another feature of the present exemplary embodiment is a position of the first flexible board in the optical axis direction.

A position of the first flexible board in the optical axis direction is located within the range (the blowing range 131b) of the blowing direction of the airflow discharged from the vent of the fan.

<Rear View of Image Sensor Unit>

A second exemplary embodiment of the present disclosure will be described with reference to FIGS. 7A to 7C and FIGS. 8A and 8B. For simplicity of the description, a description of similarities between the first and second exemplary embodiments will be omitted, and differences from the first exemplary embodiment will be described.

FIG. 7C is a rear view of the image sensor unit 106, and FIGS. 7A and 7B illustrate an A-A section and a B-B section in FIG. 7C, respectively.

FIG. 8A illustrates the image sensor unit 106 viewed from a side of the digital camera 100, and FIG. 8B illustrates a C-C section in FIG. 8A.

Unlike the first exemplary embodiment, an image pickup power flexible board 212 (212a to 212e) is disposed in an orientation reversed 180 degrees from that of the image pickup signal flexible board 111, as illustrated in FIGS. 7A and 7B.

This configuration makes it possible to cancel out the influences of the respective tensions of the image pickup power flexible board 212 and the image pickup signal flexible board 111 on the movable unit 114, and is suitable for the controllability of the movable unit 114.

However, as illustrated in FIG. 8B, a bent portion 212b of the image pickup power flexible board 212 is disposed at a position a certain distance from the Y-direction magnet 118b.

Thus, the bent portion 212b is within the blowing range 131a of the heat dissipation fan 130, and can easily receive a force from the airflow.

However, as illustrated in FIG. 8B, the thickness direction of the bent portion 212b of the image pickup power flexible board 212 is orthogonal to the blowing direction, and the bent portion 212b is disposed so as not to easily receive the force from the airflow.

In addition, as illustrated in FIG. 8B, the image pickup power flexible board 212 is bent in the Y-direction when viewed from the optical axis direction, and thus can be said to be orthogonal to the blowing direction.

Besides being advantageous to the controllability of the movable unit 114 in a case where the heat dissipation fan 130 is not driven, such a configuration can reduce the influence of the force received by the image pickup power flexible board 212 from the airflow in a case where the heat dissipation fan 130 is driven.

At the same time, the airflow generated by the heat dissipation fan 130 can spread out over a wide area on the image pickup board 115a because the airflow is not easily obstructed by the bent portion 212b, so that a temperature rise of the image sensor 115 can be effectively suppressed.

Features of the present exemplary embodiment are as follows. One of the features is that the blowing direction of the vent 131 and the thickness direction of the bent portion 212b are orthogonal to each other.

An image pickup apparatus (the digital camera 100) according to the present exemplary embodiment includes an image sensor (the image sensor 115) configured to move within a movable range of the image sensor in a direction different from an optical axis direction, a first circuit board (the image pickup board 115a) on which the image sensor is mounted, and a second circuit board (the main board 107) facing the first circuit board.

The image pickup apparatus further includes a first flexible board (the image pickup power flexible board 212) configured to electrically connect the first circuit board and the second circuit board, and a fan (the heat dissipation fan 130).

The first flexible board is bent in an area overlapping the movable range of the image sensor in the optical axis direction.

A position of the first flexible board in the optical axis direction is located within a range (the blowing range 131b) of a blowing direction of an airflow discharged from a vent of the fan.

A thickness direction of a bent portion (the bent portion 212b) of the first flexible board, which is closest to a side of the first flexible board connected to the first circuit board, is orthogonal to the blowing direction of the airflow discharged from the vent of the fan.

Another feature of the present exemplary embodiment is that the bending direction and the blowing direction are orthogonal to each other.

An image pickup apparatus according (the digital camera 100) to the present exemplary embodiment includes an image sensor (the image sensor 115) configured to move within a movable range of the image sensor in a direction different from an optical axis direction, a first circuit board (the image pickup board 115a) on which the image sensor is mounted, and a second circuit board (the main board 107) facing the first circuit board.

The image pickup apparatus further includes a first flexible board (the image pickup power flexible board 212) configured to electrically connect the first circuit board and the second circuit board, and a fan (the heat dissipation fan 130).

The first flexible board is bent in an area overlapping the movable range of the image sensor in the optical axis direction.

A position of the first flexible board in the optical axis direction is located within a range (the blowing range 131b) of a blowing direction of an airflow discharged from a vent of the fan.

A bending direction of a bent portion (the bent portion 212b) of the first flexible board, which is closest to a side of the first flexible board connected to the first circuit board, is orthogonal to the blowing direction of the airflow discharged from the vent of the fan.

Another feature of the present exemplary embodiment relates to a longitudinal direction and a short direction of the image sensor.

The blowing direction is a longitudinal direction of the image sensor, and the bending direction is a short direction of the image sensor.

A third exemplary embodiment of the present disclosure will be described with reference to FIGS. 9A and 9B and FIGS. 10A to 10D. For simplicity of the description, a description of similarities between the first and third exemplary embodiments will be omitted, and differences from the first exemplary embodiment will be described.

Figure 9A:
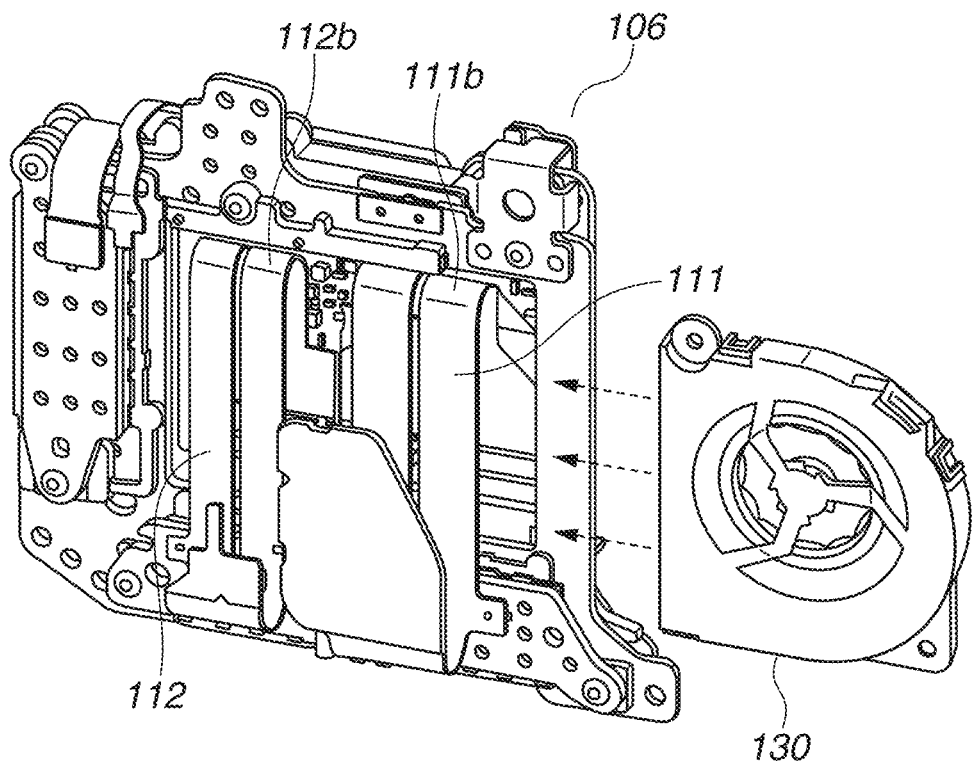
FIGS. 9A and 9B are rear perspective views of an image sensor unit and a heat dissipation fan according to a third exemplary embodiment of the present disclosure.
Figure 9B:
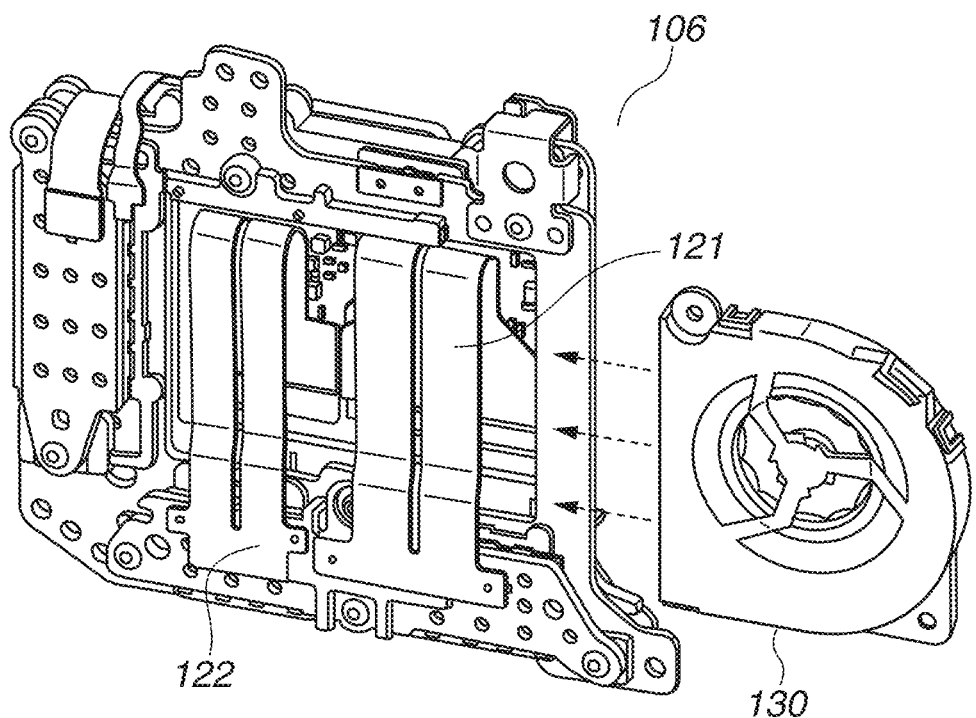

FIG. 9A is a rear view of the image sensor unit 106 and the heat dissipation fan 130 as viewed obliquely from the rear of the digital camera 100. FIG. 9B is a view in which the image pickup signal flexible board 111 and the image pickup power flexible board 112 are hidden in FIG. 9A to make it easy to view illustrated components.

In the present exemplary embodiment, the first flexible board is applied to a graphite sheet in addition to the flexible board.

As illustrated in FIGS. 9A and 9B, the image sensor unit 106 includes graphite sheets 121 and 122 each fixed to the drive mechanism 113 and the movable unit 114 to overlap the image pickup signal flexible board 111 and the image pickup power flexible board 112, respectively.

The graphite sheets 121 and 122 each function as a heat dissipation member having flexibility and less likely to affect the controllability of the movable unit 114, while transferring heat generated in the movable unit 114 to the drive mechanism 113.

Figure 10A:
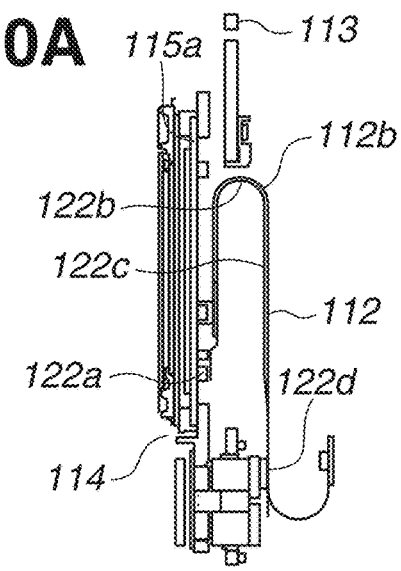
FIGS. 10A, 10B, 10C, and 10D are an A-A section view, a B-B section view, a C-C section view, and a rear view, respectively, of the image sensor unit and the heat dissipation fan according to the third exemplary embodiment.
Figure 10B:
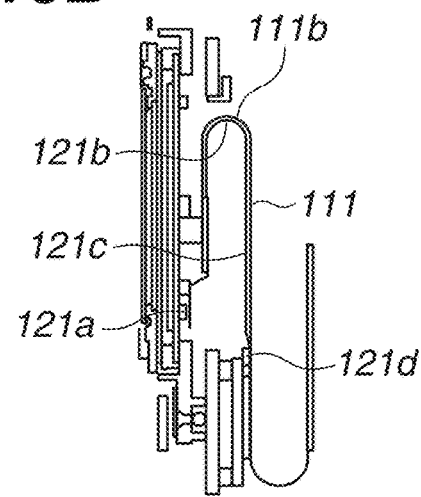
Figure 10C:
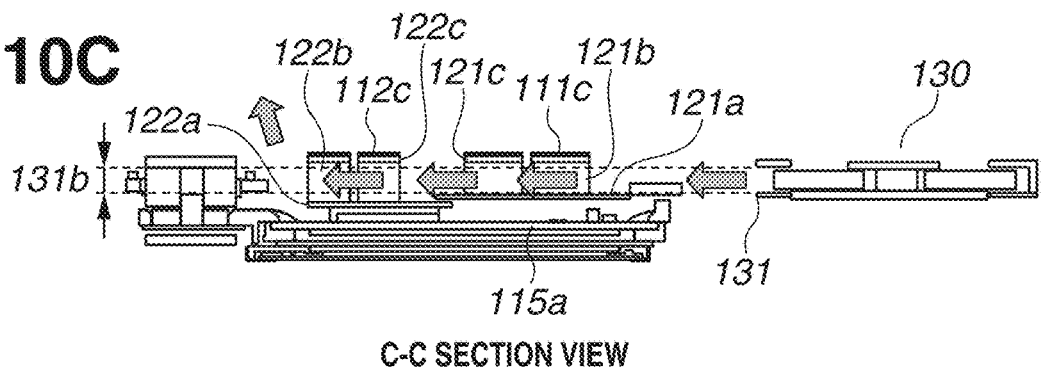
Figure 10D:
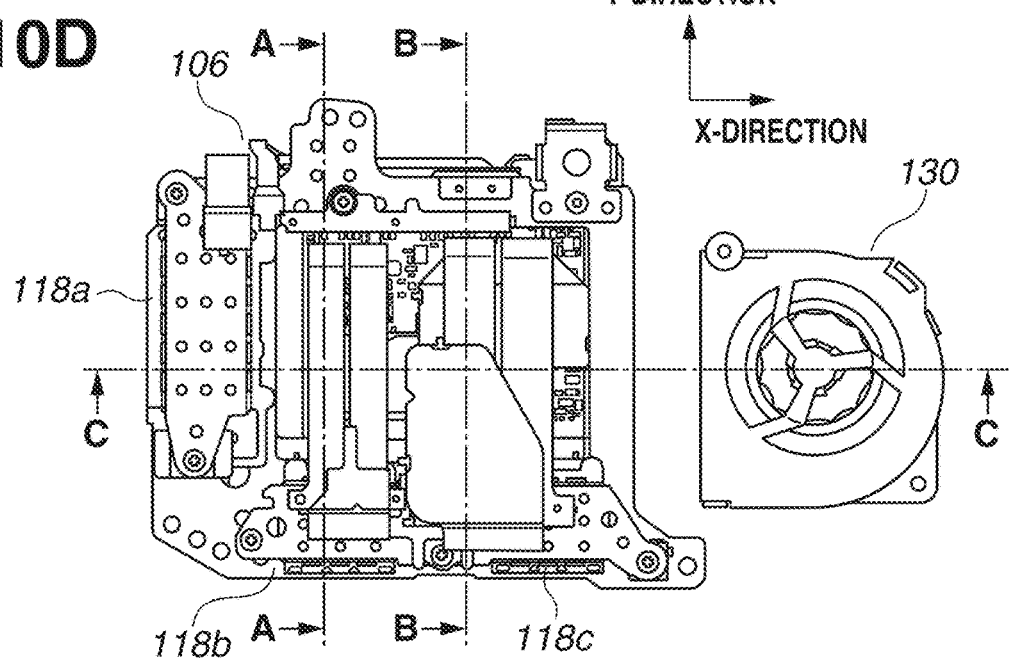

FIG. 10D is a rear view of the image sensor unit 106, and FIGS. 10A, 10B, and 10C illustrate an A-A section, a B-B section, and a C-C section in FIG. 10D, respectively.

As illustrated in FIGS. 10A, the graphite sheet 122 has a first end portion 122a attached in contact with the elements 115b on the image pickup board 115a, and extending therefrom in a direction substantially parallel to the image pickup board 115a.

The graphite sheet 122 further has a bent portion 122b extending from the first end portion 122a and bent 180 degrees with a predetermined bending radius, and a residual portion 122c forming a portion between the bent portion 122b and a fixing portion 122d for fixing the graphite sheet 122 to the drive mechanism 113.

Such a configuration reduces the influence of the tension of the graphite sheet 122 on the control of the movable unit 114 by absorbing deformation of the graphite sheet 122 using the bent portion 122b and the residual portion 122c, even if the movable unit 114 of the image sensor unit 106 is driven for shake correction.

As illustrated in FIG. 10A, the image pickup power flexible board 112 is disposed so that an inner circumferential surface (an inner surface) of the bent portion 112b of the image pickup power flexible board 112 faces an outer surface of the bent portion 122b of the graphite sheet 122.

The graphite sheet 121 has a bending configuration similar to the configuration of the graphite sheet 122 in order to keep the influence of the tension thereof on the control of the movable unit 114 to a minimum.

As illustrated in FIG. 10B, the image pickup signal flexible board 111 is disposed so that an inner circumferential surface (an inner surface) of the bent portion 111b of the image pickup signal flexible board 111 faces an outer surface of a bent portion 121b of the graphite sheet 121.

Such an arrangement can bring a fixing portion 121d of the graphite sheet 121 and the fixing portion 122d of the graphite sheet 122 into direct and fixed contact with the drive mechanism 113 without interposing the image pickup signal flexible board 111 and the image pickup power flexible board 112 therebetween.

Thus, this is suitable for heat dissipation from the movable unit 114 to the drive mechanism 113.

The configuration of the bent portions 121b and 122b of the graphite sheets 121 and 122 can be replaced with the bent portions 111b and 112b of the image pickup signal flexible board 111 and the image pickup power flexible board 112 in the first exemplary embodiment.

Thus, it is apparent that an effect similar to the effect of the first exemplary embodiment can be obtained.

Further, in the first, second, and third exemplary embodiments, the heat dissipation fan 130 itself is not physically connected to the movable unit 114, and thus the heat dissipation effect can be produced without hindering the shake correction function performed by moving the movable unit 114.

Furthermore, in the first, second, and third exemplary embodiments, the blowing direction coincides with the longitudinal direction of the image sensor 115.

The bending direction of each of the image pickup signal flexible board 111, the image pickup power flexible board 112, and the graphite sheets 121 and 122 coincides with the short direction of the image sensor 115.

Such a configuration can efficiently spread out the air on the image pickup board 115a, inside the digital camera 100 without increasing the width of the blowing direction of the heat dissipation fan 130 to match the width of the image sensor 115 in the longitudinal direction.

In the first, second, and third exemplary embodiments, for example, the heat dissipation fan 130 is in a state of being operated with an air volume of 4.5 L/min. Liter per minute (L/min) is the unit of volume flow.

Incorporation of the heat dissipation fan 130 into the digital camera 100 can reduce the maximum temperature of the image sensor unit 106 by 10° C. This suppresses the temperature rise of the heat source, making it difficult to reach a temperature limit at which the digital camera 100 stops functioning because of heat generation.

<Block Diagram Illustrating Configuration Example of Digital Camera>

FIG. 11 is a block diagram illustrating an example of a configuration of a digital camera 400 according to an exemplary embodiment of the present disclosure.

A shutter 410 is a focal plane shutter that can freely control the exposure period of an image pickup unit 411 (described below). A system control unit 420 (described below) performs this control.

The image pickup unit 411 is an image pickup device that has an image pickup plane for forming a subject image (an optical image) that has passed through a lens 501, and outputs an electrical signal (an analog signal) based on the optical image on the image pickup plane by performing photoelectric conversion.

For the image pickup unit 411, a charge-coupled device (CCD) sensor or a complementary metal-oxide semiconductor (CMOS) sensor is used.

An analog-to-digital (A/D) converter 412 is a signal conversion unit used to convert the analog signal output from the image pickup unit 411 into a digital signal.

An image processing unit 413 is an image calculation unit that generates image data by performing predetermined pixel interpolation, resizing processing such as reduction, and color conversion processing on the digital signal from the A/D converter 412 or a digital signal from a memory control unit 422 (described below).

The system control unit 420 controls an aperture position and a lens position based on a calculation result obtained by the image processing unit 413.

The image processing unit 413 further performs calculation processing using the image data, and performs through-the-lens (TTL) automatic white balance (AWB) processing based on the obtained calculation result.

The system control unit 420 includes at least one processor or circuit, and controls the entire digital camera 400.

Each process according to the present exemplary embodiment is implemented by executing a program stored in a nonvolatile memory 423 (described below).

A memory 421 is a storage unit that temporarily stores the digital signal into which the A/D converter 412 converts the analog signal obtained by the image pickup unit 411, and the image data generated by the image processing unit 413.

The memory 421 has a sufficient capacity to store a predetermined number of still images, and a moving image and sound for a predetermined length of time.

The memory control unit 422 controls transmission and reception of the data controlled by the system control unit 420 to and from the A/D converter 412, the image processing unit 413, and the memory 421.

The digital signal output from the A/D converter 412 is stored into the memory 421 via the image processing unit 413 and the memory control unit 422, or directly via the memory control unit 422.

The nonvolatile memory 423 is an electrically erasable and recordable read only storage unit, and stores constants, programs, and the like for the operation of the system control unit 420.

A system memory 424 is a readable and writable storage unit that stores constants, variables, programs read out from the nonvolatile memory 423, and the like for the operation of the system control unit 420.

A system timer 425 is a clocking unit that measures a time period before execution of automatic power-off for turning off various display members (described below), and an exposure period.

The automatic power-off has a function of turning off the various display members (described below) to prevent battery drain in a case where it is determined that a user is not operating the digital camera 400.

A power supply unit 430 includes a primary battery such as an alkaline cell or a lithium battery, a secondary battery such as a nickel-cadmium (NiCd) battery, a nickel-metal hydride (NiMH) battery, or a lithium (Li) battery, an alternating current (AC) adapter, or the like.

A power supply control unit 431 includes a circuit for detecting the power supply unit 430 serving as a power source for driving the digital camera 400, a direct current (DC)-DC converter, and a switch circuit for switching between power supply destinations.

The power supply unit 430 further detects whether the battery is attached, the type of the battery, and a remaining battery level.

In addition, the power supply control unit 431 controls the DC-DC converter based on the detection result and an instruction of the system control unit 420, and supplies an appropriate voltage to a supply destination at an appropriate timing.

A communication terminal 440 is provided in the digital camera 400, and is electrically connected to a lens communication terminal 506 (described below).

The electrical connection of the communication terminal 440 to the lens communication terminal 506 enables the system control unit 420, which controls the entire digital camera 400, to communicate with a lens unit 500 (described below).

A storage medium interface (I/F) 441 is an interface with a storage medium 600 (described below).

An attitude detection unit 442 detects an attitude of the digital camera 400 with respect to a gravity direction.

Based on the attitude detected by the attitude detection unit 442, it is possible to output orientation information about whether an image obtained by the image pickup unit 411 is an image captured by holding the digital camera 400 laterally or an image captured by holding the digital camera 400 vertically.

The system control unit 420 can add the orientation information output by the attitude detection unit 442 to the image data.

For the attitude detection unit 442, an acceleration sensor, a gyroscope sensor, or the like can be used.

When the acceleration sensor or the gyroscope sensor is used for the attitude detection unit 442, a movement (such as a panning, tilting, lifted, or stationary state) of the digital camera 400 can also be detected.

An eyepiece portion 443 is a portion in the digital camera 400 that a user's eye (an object) 700 approaches (comes in contact with).

An eye-contact detection unit 444 is an eye-contact detection sensor that detects approach (eye contact) or leaving (eye separation) of the eye 700 with respect to the eyepiece portion 443.

The eye-contact detection unit 444 detects the contact of the eye 700 with the eyepiece portion 443, based on whether light is received by a light-receiving unit (not illustrated) of an infrared proximity sensor.

After the contact of the eye 700 is detected, the system control unit 420 determines that an eye contact state continues until the separation of the eye 700 is detected.

After the separation of the eye 700 is detected, the system control unit 420 determines that a non-eye contact state continues until the contact of the eye 700 is detected.

The infrared proximity sensor is merely an example, and any other type of sensor that can detect the approach of an eye or an object as the eye contact state may be adopted for the eye-contact detection unit 444.

The memory 421 described above also serves as a memory (a video memory) for image display.

The digital signal and the image data written in the memory 421 are displayed on a rear display unit 450 or an electronic view finder (EVF) 451 via the memory control unit 422.

The rear display unit 450 performs display based on the signal from the memory control unit 422.

In a case where eye contact is detected by the eye-contact detection unit 444, the EVF 451 performs display based on the signal from the memory control unit 422.

The digital signals into which the analog signals generated by the image pickup unit 411 are converted by the A/D converter 412 are recorded in the memory 421, and sequentially transferred to the rear display unit 450 or the EVF 451 for display.

Live view imaging display, which is real time display, can be thereby performed.

The system control unit 420 switches between display (a display state) and non-display (a non-display state) of each of the rear display unit 450 and the EVF 451, depending on the state detected by the eye-contact detection unit 444 described above.

During the non-eye contact state, the rear display unit 450 is in the display state, and the EVF 451 is in the non-display state.

During the eye contact state, the EVF 451 is in the display state, and the rear display unit 450 is in the non-display state.

An operation unit 460 includes various operation members and serves as an input unit for accepting operations from the user.

The operation unit 460 includes the various operation members (a mode change switch 461, a shutter button 462, a first shutter switch 463, a second shutter switch 464, a touch panel 465, and a power switch 466) to be described below.

Further, the operation unit 460 is used to input various operation instructions to the system control unit 420.

The mode change switch 461 is used to change the operating mode of the system control unit 420 to a mode such as a still image capturing mode or a moving image capturing mode.

The still image capturing mode includes an automatic image capturing mode, an automatic scene determination mode, and a manual image capturing mode, as image capturing modes.

The still image capturing mode further includes an aperture priority (Av) mode (Av mode), a shutter speed priority mode (Time-value (Tv) mode or Tv mode), and a program automatic exposure (AE) mode (P mode), as image capturing modes.

The moving image capturing mode may similarly include a plurality of image capturing modes.

The shutter button 462 is used by the user to give an image capturing preparation instruction and an image capturing instruction.

The first shutter switch 463 is turned on in the middle of operating the shutter button 462 of the digital camera 400, i.e., when the shutter button 462 is pressed halfway (when the image capturing preparation instruction is issued), thereby generating a first shutter switch signal SW1.

The first shutter switch signal SW1 starts an image capturing preparation operation including automatic focus (AF) processing, AE processing, and AWB processing.

The second shutter switch 464 is turned on when the shutter button 462 is operated completely, i.e., when the shutter button 462 is fully pressed (when the image capturing instruction is issued), thereby generating a second shutter switch signal SW2.

The system control unit 420 performs processing from reading out the analog signal from the image pickup unit 411 to converting the signal using the A/D converter 412 and the image processing unit 413, based on the second shutter switch signal SW2.

In addition, the system control unit 420 starts an image capturing processing operation up to writing the image data temporarily recorded in the memory 421 into the storage medium 600 (described below).

The touch panel 465 is a device for detecting a touch operation or a drag operation performed by the user.

In the present exemplary embodiment, the touch panel 465 is integral with the rear display unit 450, and can be operated by the user touching a display portion of the rear display unit 450 with a finger.

The power switch 466 is used to power on or off the digital camera 400. The power supply control unit 431 controls power supply from the power supply unit 430 based on the switching operation on the power switch 466.

A heat dissipation fan 470 is controlled by the system control unit 420 to cool a heat source in the digital camera 400.

The lens unit 500 is an interchangeable lens that is detachably attached to the digital camera 400.

The lens 501 is a lens group for generating an optical image (a subject image) from subject light reflected by a subject, and includes a plurality of lenses, but one lens is illustrated in FIG. 11 for simplicity.

The lens communication terminal 506 is a communication terminal for the lens unit 500 to communicate with the digital camera 400.

The lens unit 500 is communicable with the system control unit 420 that controls the entire digital camera 400, in a state where the lens communication terminal 506 and the communication terminal 440 are electrically connected to each other as described above.

This enables the system control unit 420 to communicate with a lens drive circuit 502 and an aperture drive circuit 504 via a lens system control circuit 505 to control the position of an aperture 503 and the in-focus state of a real image formed by displacing the lens 501.

The storage medium 600, such as a memory card, is detachably attached to the digital camera 400 and provided to record captured images.

Examples of the storage medium 600 include a secure digital (SD) card, a memory that retains data in the absence of a power supply such as a FLASH® memory, and a hard disk.

INDUSTRIAL APPLICABILITY

The technique according to the exemplary embodiments of the present disclosure is applicable to electronic apparatuses and image capturing systems.

According to an exemplary embodiment of the present disclosure, it is possible to prevent the heat dissipation performance of an image sensor from being reduced due to a flexible board obstructing an airflow generated by an airflow generation unit.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-191536, filed Nov. 25, 2021, which is hereby incorporated by reference herein in its entirety.

What is claimed is:

1. An image pickup apparatus comprising:
an image sensor configured to move within a movable range of the image sensor in a direction different from an optical axis direction;
a first circuit board on which the image sensor is mounted;
a second circuit board facing the first circuit board;
a first flexible board configured to electrically connect the first circuit board and the second circuit board; and
a fan,
wherein the first flexible board includes a bent portion that is located closest to a side of the first flexible board connected to the first circuit board,
wherein the first flexible board is bent in an area overlapping the movable range of the image sensor in the optical axis direction, and
wherein, as viewed from the optical axis direction, an inner surface of the bent portion of the first flexible board is disposed to be outside a range of a blowing direction of an airflow discharged from a vent of the fan.

2. The image pickup apparatus according to claim 1, further comprising a magnet configured to move the image sensor within the movable range,
wherein the bent portion closest to the side of the first flexible board connected to the first circuit board is disposed at a position facing the magnet across a connection portion connecting the first circuit board and the first flexible board.

3. The image pickup apparatus according to claim 2, wherein, as viewed from the optical axis direction, a center of the vent of the fan is located between the bent portion closest to the side of the first flexible board connected to the first circuit board and the magnet.

4. The image pickup apparatus according to claim 1, wherein a position of the first flexible board in the optical axis direction is located within the range of the blowing direction of the airflow discharged from the vent of the fan.

5. The image pickup apparatus according to claim 1, wherein the first flexible board is a flexible board or a graphite sheet.

6. An image pickup apparatus comprising:
an image sensor configured to move within a movable range of the image sensor in a direction different from an optical axis direction;
a first circuit board on which the image sensor is mounted;
a second circuit board facing the first circuit board;
a first flexible board configured to electrically connect the first circuit board and the second circuit board; and
a fan,
wherein the first flexible board includes a bent portion that is located closest to a side of the first flexible board connected to the first circuit board,
wherein the first flexible board is bent in an area overlapping the movable range of the image sensor in the optical axis direction,
wherein a position of the first flexible board in the optical axis direction is located within a range of a blowing direction of an airflow discharged from a vent of the fan, and
wherein a thickness direction of the bent portion of the first flexible board is orthogonal to the blowing direction of the airflow discharged from the vent of the fan.

7. An image pickup apparatus comprising:
an image sensor configured to move within a movable range of the image sensor in a direction different from an optical axis direction;
a first circuit board on which the image sensor is mounted;
a second circuit board facing the first circuit board;
a first flexible board configured to electrically connect the first circuit board and the second circuit board; and
a fan,
wherein the first flexible board includes a bent portion that is located closest to a side of the first flexible board connected to the first circuit board,
wherein the first flexible board is bent in an area overlapping the movable range of the image sensor in the optical axis direction,
wherein a position of the first flexible board in the optical axis direction is located within a range of a blowing direction of an airflow discharged from a vent of the fan, and
wherein a bending direction of the bent portion of the first flexible board is orthogonal to the blowing direction of the airflow discharged from the vent of the fan.

8. The image pickup apparatus according to claim 7, wherein the blowing direction is a longitudinal direction of the image sensor, and the bending direction is a direction of the image sensor that is shorter than the longitudinal direction.

* * * * *